United States Patent
Kamizono et al.

(10) Patent No.: US 9,048,175 B2
(45) Date of Patent: Jun. 2, 2015

(54) DIFFUSION-AGENT COMPOSITION FOR FORMING AN IMPURITY-DIFFUSING AGENT LAYER ON A SEMICONDUCTOR SUBSTRATE

(75) Inventors: Takashi Kamizono, Kawasaki (JP); Toshiro Morita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/342,959

(22) PCT Filed: Sep. 3, 2012

(86) PCT No.: PCT/JP2012/005557
§ 371 (c)(1),
(2), (4) Date: Mar. 5, 2014

(87) PCT Pub. No.: WO2013/038613
PCT Pub. Date: Mar. 21, 2013

(65) Prior Publication Data
US 2014/0227865 A1 Aug. 14, 2014

(30) Foreign Application Priority Data
Sep. 12, 2011 (JP) .................................. 2011-198734
Jul. 11, 2012 (JP) .................................. 2012-155806

(51) Int. Cl.
*H01L 21/22* (2006.01)
*H01L 21/225* (2006.01)
*H01L 31/068* (2012.01)

(52) U.S. Cl.
CPC ........... *H01L 21/2225* (2013.01); *Y02E 10/547* (2013.01); *H01L 21/2254* (2013.01); *H01L 31/068* (2013.01); *H01L 21/225* (2013.01)

(58) Field of Classification Search
CPC ........ H01L 31/18; H01L 21/225; H01L 21/22

USPC ............. 106/31.01, 287.13; 438/57, 542, 562
See application file for complete search history.

(56) References Cited

FOREIGN PATENT DOCUMENTS

| JP | 57073931 A | * | 5/1982 | ............ H01L 21/22 |
| JP | 04085821 A | * | 3/1992 | ........... H01L 21/225 |

(Continued)

OTHER PUBLICATIONS

International Search Report mailed on Nov. 20, 2012 in International application No. PCT/JP2012/005557

(Continued)

*Primary Examiner* — Caleb Henry
(74) *Attorney, Agent, or Firm* — Knobbe Martens Olson & Bear LLP

(57) ABSTRACT

A diffusion-agent composition including a borate ester (A); a polyhydric alcohol (B) represented by general formula (1); and an alkoxysilane compound (C). In general formula (1), k represents an integer from 0 to 3, m represents an integer of 1 or more, and $R^2$ and $R^3$ each independently represent a hydrogen atom, a hydroxyl group, a $C_{1-5}$ alkyl group, or a $C_{1-5}$ hydroxyalkyl group. When there are a plurality of $R^2$s and $R^3$s, the plurality of $R^2$s and $R^3$s may be the same as or different from one another. When k is 2 or more, the plurality of $R^2$s and $R^3$s always include at least one or more hydroxyl groups or $C_{1-5}$ hydroxyalkyl groups having 1 to 5 carbon atoms. $R^4$ and $R^5$ each independently represent a hydrogen atom or a $C_{1-3}$ alkyl group.

[Formula 1]

-continued
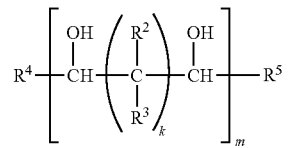
(1)
6 Claims, 3 Drawing Sheets

(56) References Cited

FOREIGN PATENT DOCUMENTS

| JP | 09181009 A | * | 7/1997 | ............ H01L 21/225 |
| WO | WO 2009/120437 A1 | | 10/2009 | |
| WO | WO 2010/077800 A1 | | 7/2010 | |
| WO | WO 2011/011467 A2 | | 1/2011 | |

OTHER PUBLICATIONS

Written Opinion of the International Search Authority mailed on Nov. 20, 2012 in International application No. PCT/JP2012/005557

* cited by examiner

DIFFUSION-AGENT COMPOSITION FOR FORMING AN IMPURITY-DIFFUSING AGENT LAYER ON A SEMICONDUCTOR SUBSTRATE

RELATED APPLICATIONS

This application is the U.S. National Phase filing under 35 U.S.C. §371 of PCT/JP2012/005557, filed Sep. 3, 2012, entitled "DIFFUSION-AGENT COMPOSITION, METHOD FOR FORMING IMPURITY-DIFFUSION LAYER, AND SOLAR CELL", which designated the United States and was published in Japanese on Mar. 21, 2013 as WO 2013/038613, and claims priority to Japanese Patent Application No. 2011-198734, filed Sep. 12, 2011; and Japanese Patent Application No. 2012-155806, filed Jul. 11, 2012. The entire contents of these applications are incorporated herein by reference.

FIELD OF THE INVENTION

The present invention relates to a diffusing agent composition, a method of forming an impurity diffusion layer, and a solar cell.

DESCRIPTION OF THE RELATED ART

A silicon semiconductor device having a P-type region in which boron is diffused is used for the manufacturing of transistors, diodes, ICs, and the like. Conventionally, as a method for diffusing boron into a silicon substrate, a thermal decomposition method, an opposing NB method, a dopant host method, a coating method, and the like have been mainly used. Of these methods, a coating method is preferably employed since the coating method does not require expensive apparatuses, allows for uniform diffusion, and is excellent in mass productivity. In particular, a method where a coating liquid containing boron is applied by a spin coater or the like is preferred.

Conventionally, various polyboron films (PBF) have been suggested that are boron-containing diffusing agent compositions used in a diffusing agent coating method such as a spin coating method or the like (see patent documents No. 1-No. 6).

However, in recent years, there is a need for cost reduction, high throughput, and reduction in environmental burden in semiconductor manufacturing related fields, particularly, solar cell manufacturing fields. More specifically, for example, in a case of manufacturing a silicon-based solar cell, there is a need for reducing a used amount of a coating liquid for diffusion and partially forming regions with different diffusion carriers and diffusion concentrations, i.e., achieving partial diffusion, in a single silicon substrate with a fewer number of steps. In this case, in a conventional spin coating method, the amount of a coating liquid used for each substrate is large, increasing the cost as well as the amount of a waste liquid. In partial diffusion, since it is necessary to form a diffusion protection film or the like on a silicon substrate in advance, the number of steps increases. On these backgrounds, a method has been developed recently for partial diffusion by partially printing a coating liquid on a silicon substrate by an ink-jet printing method, a screen printing method, or the like.

[Patent document No. 1] Japanese Patent Application Publication No. 9-181010
[Patent document No. 2] Japanese Patent Application Publication No. 4-53127
[Patent document No. 3] Japanese Patent Application Publication No. 9-181009
[Patent document No. 4] Japanese Patent No. 3519847
[Patent document No. 5] Japanese Patent Application Publication No. 57-73931
[Patent document No. 6] Japanese Patent Application Publication No. 2010-62223

In general, in boron diffusion where a conventional PBF is used, a hydroxyl group-containing polymer compound serving as a binder for boron is decomposed by combustion before diffusing boron after the application of a PBF liquid on a silicon substrate. Therefore, boron compounds ($B_2O_3$) form a coating film independently at the time of boron diffusion, and boron can thus be easily scattered from the boron coating film on the silicon substrate to the outside of the coating film. Thus, in a case where partial diffusion is performed using such a PBF, out-diffusion can easily occur in which boron is diffused in a neighboring substrate or in a region where a PBF is not applied, and the partial diffusion is thus difficult.

Also, in a boron diffusing agent composition in which boron compounds ($B_2O_3$, boric acid or the like) are dissolved in an organic solvent without using a binder such as polyvinyl alcohol or the like contained in a conventional PBF, there is a tendency that boron compounds are easily aggregated and deposited when a coating film is formed. However, in order to prevent a variation in a resistance value and a disturbance of a junction of an impurity-diffusing agent layer that is formed, it is required for a diffusing agent composition that the aggregation of contained compounds hardly occurs and that highly-concentrated and uniform boron diffusion is allowed.

In this background, a purpose of the present invention is to provide: a diffusing agent composition that is capable of suppressing the generation of out-diffusion and the aggregation of boron compounds that are contained; a method of forming an impurity diffusion layer using the diffusing agent composition; and a solar cell.

One embodiment of the present invention relates to a diffusing agent composition. This diffusing agent composition is a diffusing agent composition used to form an impurity-diffusing agent layer on a semiconductor substrate including: a borate ester (A); a polyhydric alcohol (B)

[Formula 1]

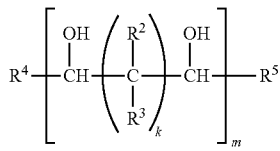

(1)

[In the general formula (1), k represents an integer of 0 to 3, m represents an integer of 1 or more, and $R^2$ and $R^3$ each individually represent a hydrogen atom, a hydroxyl group, an alkyl group having 1 to 5 carbon atoms, or a hydroxyalkyl group having 1 to 5 carbon atoms. When there are a plurality of $R^2$s and $R^3$s, the plurality of $R^2$s and $R^3$s may be the same or different from one another. When k is 2 or more, the plurality of $R^2$s and $R^3$s always contain one or more hydroxyl group or hydroxyalkyl group having 1 to 5 carbon atoms. $R^4$ and $R^5$ each individually represent a hydrogen atom or an alkyl group having 1 to 3 carbon atoms.]

According to this embodiment, the generation of out-diffusion and the aggregation of boron compounds that are contained can be suppressed.

Another embodiment of the present invention is a method of forming an impurity diffusion layer. This, method of forming an impurity diffusion layer includes: patterning a semiconductor substrate to form an impurity-diffusing agent layer of a predetermined pattern by selectively applying the diffusing agent composition according to the above embodiment onto the semiconductor substrate; and diffusing boron of the borate ester (A) included in the diffusing agent composition into the semiconductor substrate.

According to the embodiment, an impurity diffusion layer can be formed with higher accuracy.

Yet another embodiment of the present invention relates to a solar battery. This solar cell includes a semiconductor substrate in which an impurity diffusion layer is formed by the method of forming an impurity diffusion layer according to the above embodiment.

According to the embodiment, a more reliable solar cell can be obtained.

Embodiments will now be described, by way of example only, with reference to the accompanying drawings which are meant to be exemplary, not limiting, and wherein like elements are numbered alike in several Figures, in which:

BRIEF DESCRIPTION OF THE DRAWINGS

In FIG. 1A, an N-type semiconductor substrate is prepared. In FIG. 1B, a texture portion having a fine concavo-convex structure is formed on one main surface of the substrate. In FIG. 1C, a diffusing agent composition is selectively applied onto the main surface of the substrate on the side of the texture portion. In FIG. 1D, the substrate on which the diffusing agent composition is applied is placed inside a diffusion furnace and burned.

In FIG. 2A, the diffusing agent composition is removed. In FIG. 2B, a passivation film is formed on the main surface of the substrate on the side of the texture portion. In FIG. 2C, patterning of a surface electrode is formed on the main surface of the substrate on the side of the passivation film. In FIG. 2D, the semiconductor substrate is placed inside an electric furnace and burned.

In FIG. 3A, a dummy substrate on which a diffusing agent composition was not applied was prepare separately from a semiconductor substrate on which a diffusing agent composition was applied. In FIG. 3B. semiconductor substrates according to exemplary embodiments 1-3 and comparative examples 2 and 6 and the dummy substrate were placed adjacent to each other in a diffusion furnace.

Figure 1A:
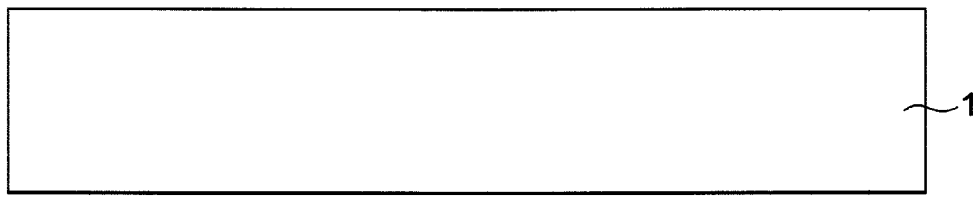
FIG. 1A through FIG. 1D are process sectional views for explaining a method of manufacturing a solar cell including a method of forming an impurity diffusion layer according to an embodiment of the invention.

Described below is an explanation of the present invention based on preferred embodiments. Reference herein to details of the illustrated embodiments is not intended to limit the scope of the claims. It should be understood that not all of the features and the combination thereof discussed are essential to the invention.

The diffusing agent composition according to the present embodiment is used to form an impurity-diffusing agent layer on a semiconductor substrate and, in particular, preferably used to form an impurity-diffusing agent layer having a predetermined pattern by selective application.

The diffusing agent composition according to the present embodiment contains a borate ester (A), a polyhydric alcohol (B), and an alkoxysilane compound (C). Also, the diffusing agent composition contains an organic solvent (D) as an optional component. Each component of the diffusing agent composition according to the present embodiment is described in detail in the following.

<Borate Ester (A)>

The borate ester (A) is a compound used as a dopant for manufacturing a solar cell. The borate ester (A) is a compound of a Group III (the Group 13) element and contains boron, which is a P-type impurity-diffusing component. The borate ester (A) is capable of forming a P-type impurity diffusion layer (impurity diffusion region) within a semiconductor substrate. More specifically, the borate ester (A) is capable of forming a P-type impurity diffusion layer in an N-type semiconductor substrate and a $P^+$-type (high concentration P-type) impurity diffusion layer in a P-type semiconductor substrate.

The concentration of the borate ester (A) is appropriately adjusted in accordance with the layer thickness, etc., of an impurity diffusion layer formed on the semiconductor substrate. For example, the borate ester (A) is preferably contained in an amount of 0.1 percent by mass or greater with respect to the entire mass of the diffusing agent composition and more preferably in an amount of 1.0 percent by mass or greater. The borate ester (A) is preferably contained in an amount of 50 percent by mass or less with respect to the entire mass of the diffusing agent composition. Boron atoms in the borate ester (A) is preferably contained in a range of 0.01 to 10 percent by mass with respect to the entire mass of the diffusing agent composition and more preferably in a range of 0.1 to 3 percent by mass.

In the present embodiment, the borate ester (A) has a structure represented by the following general formula (2):

$$B(OR^1)_3 \quad (2)$$

[In the general formula (2), each $R^1$ individually represents an alkyl group having 1 to 10 carbon atoms or an aryl group having 6 to 10 carbon atoms. Three $R^1$s may all be the same or different.]

When $R^1$ is an alkyl group, a linear or branched-chain alkyl group having 1 to 4 carbon atoms is more preferred. An aryl group is, for example, a phenyl group, a naphthyl group, or the like. An alkyl group and an aryl group may have a substituent.

Specific examples of the borate ester (A) can include, for example, trimethyl borate, triethyl borate, tripropyl borate, tributyl borate, tripentyl borate, trihexyl borate, trioctyl borate, triphenyl borate, and the like. Among these borate esters (A), trimethyl borate and triethyl borate are preferred since trimethyl borate and triethyl borate are likely to show more aggregation and deposition suppressing effects. These borate esters (A) may be used alone or in combination of two or more thereof.

<Polyhydric Alcohol (B)>

The polyhydric alcohol (B) is represented by the following general formula (1):

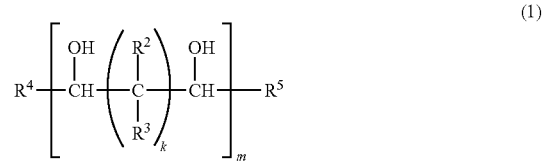

[In the general formula (1), k represents an integer of 0 to 3, m represents an integer of 1 or more, and $R^2$ and $R^3$ each individually represent a hydrogen atom, a hydroxyl group, an alkyl group having 1 to 5 carbon atoms, or a hydroxyalkyl group having 1 to 5 carbon atoms. When there are a plurality of $R^2$s and $R^3$s, the plurality of $R^2$s and $R^3$s may be the same or different from one another. When k is 2 or more, the plurality of $R^2$s and $R^3$s always contain one or more hydroxyl group or hydroxyalkyl group having 1 to 5 carbon atoms. $R^4$ and $R^5$ each individually represent a hydrogen atom or an alkyl group having 1 to 3 carbon atoms.]

Specific examples of the polyhydric alcohol (B) can include ethylene glycol, propylene glycol, 1,3-butanediol, trimethylolpropane, 3-methylpentane-1,3,5-triol, mannitol, and the like. These polyhydric alcohols may be used alone or in combination of two or more thereof.

It can be considered that containing a polyhydric alcohol (B) having a specific structure in the diffusing agent composition in addition to containing a P-type impurity-diffusing component in the diffusing agent composition in the form of a borate ester (A) allows the polyhydric alcohol (B) and the borate ester (A) to efficiently form a complex, thereby suppressing the hydrolysis of the borate ester (A) and thus allowing the aggregation and deposition of boron compounds to be suppressed. Since the aggregation and deposition of boron compounds can be suppressed, the generation of out-diffusion can be prevented where boron is scattered from a coating film of the diffusing agent composition, which is applied on a semiconductor substrate or the like, to the outside of the coating film and becomes attached and diffused in a neighboring substrate or a region where the diffusing agent composition is not applied.

Regarding the content ratio of the borate ester (A) and the polyhydric alcohol (B) in the diffusing agent composition, the content of the borate ester (A) is preferably 5-fold by mol or less relative to the content of the polyhydric alcohol (B) and is more preferably 2-fold by mol or less. Since the borate ester (A) is capable of forming a complex effectively, the content of the polyhydric alcohol (B) is more preferably larger than the content of the borate ester (A), that is, the content of the borate ester (A) is more preferably less than 1-fold by mole relative to the content of the polyhydric alcohol (B).

<Alkoxysilane Compound (C)>

The alkoxysilane compound (C) includes a reaction product obtained by hydrolyzing an alkoxysilane represented by the following general formula (3):

$$R^6{}_n Si(OR^7)_{4-n} \qquad (3)$$

[In the general formula (3), $R^6$ represents a hydrogen atom or an organic group, $R^7$ represents an organic group, and n represents an integer of 0, 1 or 2. When there are a plurality of $R^6$s, the plurality of $R^6$s may be the same or different from one another. When there are a plurality of $(OR^7)$s, the plurality of $(OR^7)$s may be the same or different from one another.]

Examples of organic groups for $R^6$ and $R^7$ can include, for example, alkyl groups, aryl groups, allyl groups, glycidyl groups, and the like. Among these groups, alkyl groups and aryl groups are preferred. An organic group for $R^6$ is more preferably, for example, a linear or branched-chain alkyl group having 1 to 20 carbon atoms and even more preferably a linear or branched-chain alkyl group having 1 to 4 carbon atoms in terms of reactivity. At least one $R^6$ is preferably an alkyl group or aryl group. The aryl group preferably has, for example, 6 to 20 carbon atoms and can be, for example, a phenyl group, a naphthyl group, or the like. An organic group for $R^7$ is more preferably, for example, a linear or branched-chain alkyl group having 1 to 5 carbon atoms and even more preferably an alkyl group having 1 to 3 carbon atoms in terms of reactivity. The aryl group, preferably has, for example, 6 to 20 carbon atoms and can be, for example, a phenyl group, a naphthyl group, or the like.

When n in the general formula (3) is 0, an alkoxysilane (i) is represented, for example, by the following general formula (4):

$$Si(OR^{21})_a(OR^{22})_b(OR^{23})_c(OR^{24})_d \qquad (4)$$

[In the general formula (4), $R^{21}$, $R^{22}$, $R^{23}$, and $R^{24}$ each independently represent the same organic group as defined for the $R^7$, and a, b, c, and d are integers satisfying the following conditions: $0 \le a \le 4$, $0 \le b \le 4$, $0 \le c \le 4$, and $0 \le d \le 4$; and $a+b+c+d=4$.]

Specific examples of the alkoxysilane (i) include, for example, tetraalkoxysilanes such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane, etc. Among them, tetramethoxysilane and tetraethoxysilane are preferred in terms of reactivity.

When n in the general formula (3) is 1, an alkoxysilane (ii) is represented, for example, by the following general formula (5):

$$R^{31}Si(OR^{32})_e(OR^{33})_f(OR^{34})_g \qquad (5)$$

[In the general formula (5), $R^{31}$ represents the same hydrogen atom or organic group as defined for the above $R^6$; $R^{32}$, $R^{33}$, and $R^{34}$ each independently represent the same organic group as defined for the above $R^7$; and e, f, and g are integers satisfying conditions as follows: $0 \le e \le 3$, $0 \le f \le 3$; and $0 \le g \le 3$, and $e+f+g=3$.]

Specific examples of the alkoxysilane (ii) include, for example, methyltrimethoxysilane, methyltriethoxysilane, methyltripropoxysilane, methyltripentyloxysilane, ethyltrimethoxysilane, ethyltripropoxysilane, ethyltripentyloxysilane, ethyltriphenyloxysilane, propyltrimethoxysilane, propyltriethoxysilane, propyltripentyloxysilane, propyltriphenyloxysilane, butyltrimethoxysilane, butyltriethoxysilane, butyltripropoxysilane, butyltripentyloxysilane, butyltriphenyloxysilane, methylmonomethoxydiethoxysilane, ethylmonomethoxydiethoxysilane, propylmonomethoxydiethoxysilane, but ylmonomethoxydiethoxysilane, methylmonomethoxydipropoxysilane, methylmonomethoxydipentyloxysilane, methylmonomethoxydiphenyloxysilane, ethylmonomethoxydipropoxysilane, ethylmonomethoxydipentyloxysilane, ethylmonomethoxydiphenyloxysilane, propylmonomethoxydipropoxysilane, propylmonomethoxydipentyloxysilane, propylmonomethoxydiphenyloxysilane, butylmonomethoxydipropoxysilane, butylmonomethoxydipentyloxysilane, butylmonomethoxydiphenyloxysilane, methylmethoxyethoxypropoxysilane, propylmethoxyethoxypropoxysilane, butylmethoxyethoxypropoxysilane, methylmonomethoxymonoethoxymonobutoxysilane, ethylmonomethoxymonoethoxymonobutoxysilane, propylmonomethoxymonoethoxymonobutoxysilane, butylmonomethoxymonoethoxymonobutoxysilane, etc. Among them, methyltrialkoxysilane, in particular, methyltrimetoxysilane and methyltriethoxysilane are preferred in terms of reactivity.

When n in the general formula (3) is 2, an alkoxysilane (iii) is represented, for example, by the following general formula (6):

$$R^{41}R^{42}Si(OR^{43})_h(OR^{44})_i \quad (6)$$

[In the general formula (6), $R^{41}$ and $R^{42}$ represent the same hydrogen atom or organic group as defined for the above $R^6$; $R^{43}$ and $R^{44}$ each independently represent the same organic group as defined for $R^7$; and h and i are integers satisfying conditions as follows: 0≤h≤2; 0≤i≤2; and h+i=2.]

Specific examples of the alkoxysilane (iii) include, for example, methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, dibutylethoxypropoxysilane, etc. Among them, methyldimethoxysilane and methyldiethoxysilane are preferred.

The alkoxysilane compound (C) can be prepared by a method of hydrolyzing one or more kinds of alkoxysilanes selected from the above alkoxysilanes (i) to (iii) in the presence of an acid catalyst, water, and an organic solvent.

As described above, water is used for a hydrolysis reaction of an alkoxysilane. In the diffusing agent composition according to the present embodiment, the content of water based on the total composition is preferably 1 percent by mass or less and more preferably 0.5 percent by mass or less, and, even more preferably, the diffusing agent composition substantially does not contain water. This allows the storage stability of the diffusing agent composition to be further improved.

Either of an organic acid and an inorganic acid can be used for the acid catalyst. Sulfuric acid, phosphoric acid, nitric acid, hydrochloric acid, or the like can be used as the inorganic acid. Among them, phosphoric acid and nitric acid are preferred. As the organic acid, the following can be used: a carboxylic acid such as formic acid, oxalic acid, fumaric acid, maleic acid, glacial acetic acid, acetic anhydride, propionic acid, n-butyric acid, and the like; and an organic acid having a sulfur-containing acid residue. Examples of the organic acid having a sulfur-containing acid residue include an organic sulfonic acid, and esterificated compounds thereof include an organic sulfate ester, an organic sulfite ester, and the like. Among them, an organic sulfonic acid, for example, a compound represented by the following general formula (7) is particularly preferred:

$$R^{13}-X \quad (7)$$

[In the general formula (7), $R^{13}$ represents a hydrocarbon group that may have a substituent, and X represents a sulfonic acid group.]

In the general formula (7), the hydrocarbon group represented as $R^{13}$ is preferably a hydrocarbon group having 1 to 20 carbon atoms. This hydrocarbon group may be saturated or unsaturated and may be linear, branched, or cyclic. When the hydrocarbon group represented as $R^{13}$ is cyclic, an aromatic hydrocarbon group, for example, a phenyl group, a naphthyl group, an anthryl group, or the like is preferred. Among them, a phenyl group is particularly preferred. To the aromatic ring of the aromatic hydrocarbon group, one or more hydrocarbon groups having 1 to 20 carbon atoms may be bonded as substituents. The hydrocarbon groups serving as the substituents on the aromatic ring may be saturated or unsaturated and may be linear, branched, or cyclic. The hydrocarbon group represented as $R^{13}$ may have one or more substituents. Examples of the substituents include halogen atoms, such as fluorine atoms, and sulfonic acid, carboxyl, hydroxyl, amino, and cyano groups.

The acid catalyst acts as a catalyst when the alkoxysilane is hydrolyzed in the presence of water. The amount of the acid catalyst that is used is preferably prepared such that the concentration thereof in the hydrolysis reaction system is in a range of 1 to 1000 ppm and, in particular, in a range of 5 to 800 ppm. The hydrolysis rate of a siloxane polymer changes in accordance with the amount of water that is added. Thus, the amount of water that is added is determined in accordance with the hydrolysis rate to be obtained.

Examples of the organic solvent in the reaction system for the hydrolysis reaction include, for example, monohydric alcohols such as methanol, ethanol, propanol, isopropanol (IPA), and n-butanol; alkyl carbonates such as methyl 3-methoxypropionate, and ethyl 3-ethoxypropionate; polyhydric alcohols such as ethylene glycol, diethylene glycol, propylene glycol, glycerin, trimethylolpropane, and hexanetriol; monoethers of a polyhydric alcohol, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether and propylene glycol monobutyl ether, and a monoacetate of any one of these compounds; esters such as methyl acetate, ethyl acetate, and butyl acetate; ketones such as acetone, methyl ethyl ketone, and methyl isoamyl ketone; polyhydric alcohol ethers each obtained by alkyl-etherizing all hydroxyl groups of a polyhydric alcohol, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methyl ethyl ether. These organic solvents may be used alone or in combination of two or more thereof.

In such a reaction system, the alkoxysilane is hydrolyzed to yield an alkoxysilane compound (C). The hydrolysis reaction is usually performed in a period of about 1 to 100 hours. In order to shorten the reaction period, the system is preferably heated in a temperature range that does not exceed 80° C.

After the end of the reaction, a reaction solution is yielded that contains a synthesized alkoxysilane compound (C) and the organic solvent used for the reaction. After separation from the organic solvent by a conventionally-known method, the alkoxysilane compound (C) can be obtained in a dry solid state or in a solution state where the solvent is substituted with another solvent if necessary.

<Organic Solvent (D)>

The diffusing agent composition according to the present embodiment contains an organic solvent (D) as an optional component. The organic solvent (D) is an organic solvent other than the polyhydric alcohol (B). Examples of the organic solvent (D) include, for example: alcohols such as methanol, ethanol, isopropanol, and butanol; ketones such as acetone, diethyl ketone, and methyl ethyl ketone; esters such as methyl acetate, ethyl acetate, and butyl acetate; polyhydric alcohols such as dipropylene glycol; ethers such as dipropylene glycol dimethyl ether, ethylene glycol dimethyl ether, ethylene glycol diethyl ether, propylene glycol dimethyl ether, and propylene glycol diethyl ether; monoether-moiety-containing glycols such as ethylene glycol monomethyl ether, ethylene glycol monoethyl ether, propylene glycol monomethyl ether, propylene glycol monoethyl ether, and dipropylene glycol monomethyl ether; cyclic ethers such as tetrahydrofuran, and dioxane; ether-moiety-containing esters such as propylene glycol monomethyl ether acetate, and propylene glycol monoethyl ether acetate.

The diffusing agent composition according to the present embodiment may contain a commonly-used surfactant, antifoaming agent, and the like as other components. For example, when the composition contains a surfactant, the paintability, flattenability, and developability of the composition can be improved, and the generation of unevenness can thus be reduced in a diffusing agent composition layer formed after the application. Although a conventionally known surfactant can be used as such a surfactant, silicone-based surfactant is preferably used. In addition, the surfactant is preferably contained in a range of 500 to 3000 ppm (parts per million) by mass and particularly 600 to 2500 ppm by mass, based on the entire diffusing agent composition. Even more preferably, the surfactant is contained in an amount of 2000 ppm by mass or less since a diffusing agent composition layer obtained after diffusion treatment has excellent detachability when the surfactant is contained in the amount. The surfactant may be used alone or in combination.

The concentration of metal impurities (other than metal components contained in the aforementioned borate ester (A), the polyhydric alcohol (B), and the alkoxysilane compound (C)) contained in the diffusing agent composition is preferably 500 ppb (parts per billion) or less. Thereby, a drop in the efficiency of a photovoltaic effect, which is caused when metal impurities are contained, can be suppressed.

<Method of Preparing Diffusing Agent Composition>

The diffusing agent composition according to the present embodiment can be prepared by mixing the above-stated components in arbitrary order by a conventionally-known method in such a manner a homogeneous solution is prepared.

<Method of Forming Impurity Diffusion Layer and Method of Manufacturing Solar Cell>

In reference to FIGS. 1A through 2D, a detailed description will be made regarding a method of forming a P-type impurity diffusion layer on an N-type semiconductor substrate and a method of manufacturing a solar cell provided with the semiconductor substrate on which the impurity diffusion layer is formed by the aforementioned method. FIG. 1A through FIG. 1D and FIG. 2A through FIG. 2D are process sectional views for explaining a method of manufacturing a solar cell including a method of forming an impurity diffusion layer according to an embodiment.

Figure 1B:
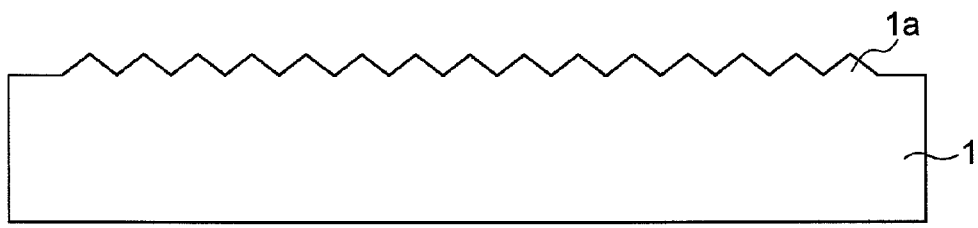

As shown in FIG. 1A, an N-type semiconductor substrate 1 such as a silicon substrate is prepared first. As shown in FIG. 1B, a texture portion 1a having a fine concavo-convex structure is then formed on one main surface of the semiconductor substrate 1 by a well-known wet etching method. The texture portion 1a prevents reflection of light on the surface of the semiconductor substrate 1.

Then, as shown in FIG. 10, a diffusing agent composition 2 described above is selectively applied onto the main surface of the semiconductor substrate 1 on the side of the texture portion 1a. For example, the diffusing agent composition 2 is selectively applied onto the surface of the semiconductor substrate 1 by an ink-jet printing method, a screen printing method, a spray coating method, a roll coat printing method, a letterpress printing method, an intaglio printing method, an offset printing method, or the like. After an impurity-diffusing agent layer of a predetermined pattern is formed as described above, the applied diffusing agent composition 2 is dried by using a well-known means such as an oven.

Figure 1C:
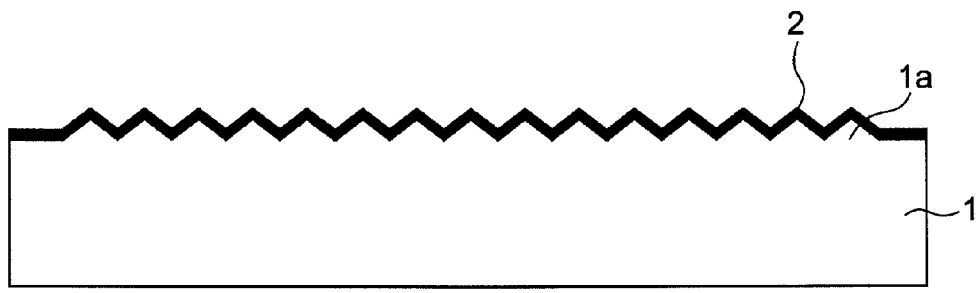
Figure 1D:
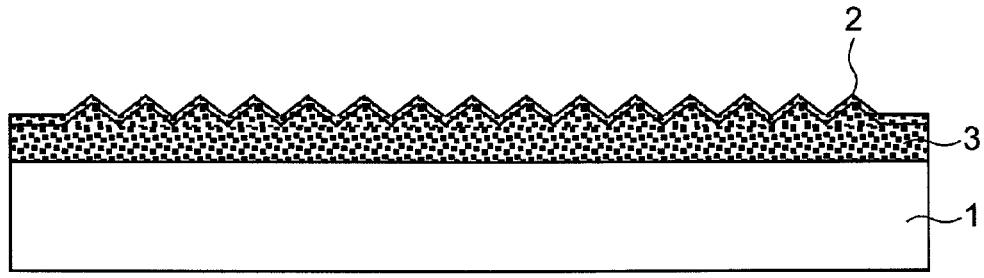

Then, as shown in FIG. 1D, the semiconductor substrate 1 on which the diffusing agent composition 2 is applied is placed inside a diffusion furnace and then burned. After the burning of the semiconductor substrate 1, boron in the borate ester (A) contained in the diffusing agent composition 2 is allowed to diffuse into the semiconductor substrate 1 through the surface of the semiconductor substrate 1 in the diffusion furnace. Instead of a diffusion furnace, the semiconductor substrate 1 may be heated by commonly-used laser irradiation. In this manner, the boron in the borate ester (A) diffuses into the semiconductor substrate 1, and a P-type impurity diffusion layer 3 is formed.

Figure 2A:
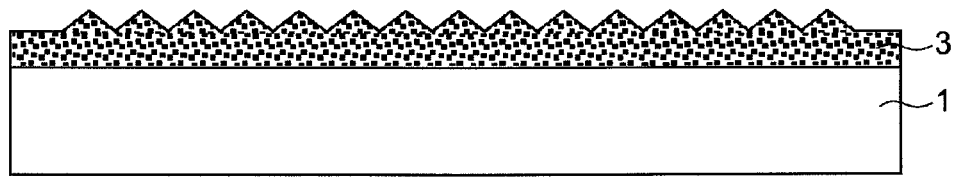
FIG. 2A through FIG. 2D are process sectional views for explaining a method of manufacturing a solar cell including a method of forming an impurity diffusion layer according to an embodiment of the invention.
Figure 2B:
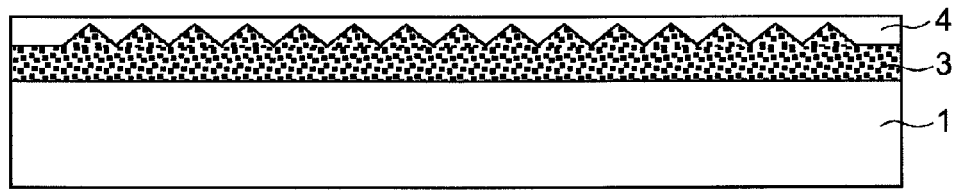

As shown in FIG. 2A, the diffusing agent composition 2 is then removed by a well-known etching method. Next, as shown in FIG. 2B, a passivation film 4 composed of a silicon nitride film (SiN film) is formed on the main surface of the semiconductor substrate 1 on the side of the texture portion 1a using a well-known chemical vapor deposition method (CVD method), e.g., a plasma CVD method. The passivation film 4 also functions as an antireflective film.

Figure 2C:
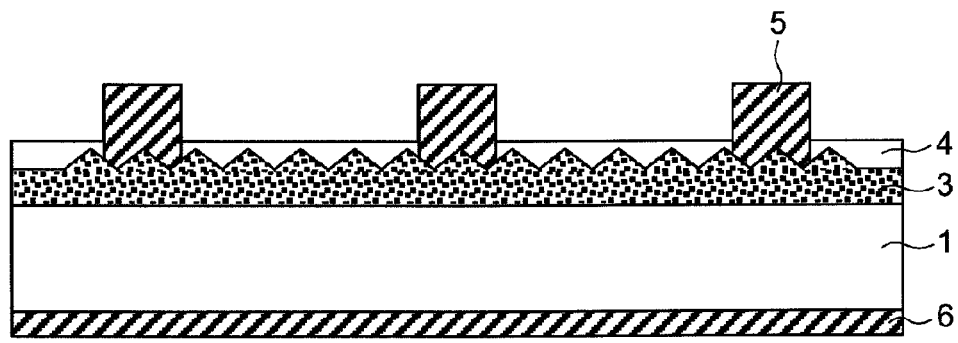

Next, as shown in FIG. 2C, patterning of a surface electrode 5 is formed on the main surface of the semiconductor substrate 1 on the side of the passivation film 4 by, for example, screen printing of a silver (Ag) paste. The surface electrode 5 is formed into a pattern to improve the efficiency of a solar cell. Also, a backside electrode 6 is formed on the other main surface of the semiconductor substrate 1 by, for example, screen printing of an aluminum (Al) paste.

Figure 2D:
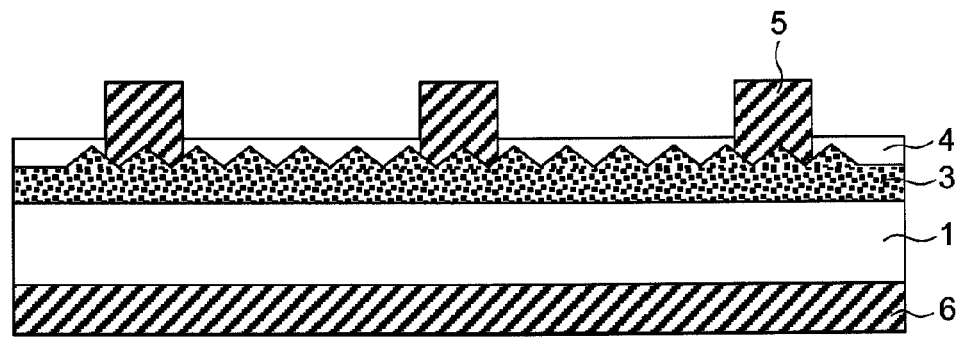

Then, as shown in FIG. 2D, the semiconductor substrate 1 on which the backside electrode 6 is formed is placed inside an electric furnace and burned, and aluminum forming the backside electrode 6 is then diffused into the semiconductor substrate 1. This allows electrical resistance on the side of the backside electrode 6 to be reduced. A solar cell 10 according to the present embodiment can be manufactured by the above steps.

As explained above, the diffusing agent composition according to the present embodiment contains a borate ester (A) and a polyhydric alcohol (B). This allows for the suppression of the aggregation and deposition of the borate ester (A), and the generation of out-diffusion can thus be suppressed. Therefore, the diffusing agent composition can be preferably employed for a diffusing method of selectively applying a diffusing agent composition on a substrate so as to partially diffuse impurity-diffusing components.

In a conventional PBF, the solubility of a resin or a boron compound in an organic solvent is generally low. Thus, the composition of the solvent is conventionally composed of water and a highly polar solvent that is miscible with water. Therefore, in a case of applying a PBF solution on a substrate using an ink-jet printing method or a screen printing method, metal components might be eluted from an ink-jet head or a screen mesh due to contact of the PBF solution. If the metal components are eluted, a printer becomes deteriorated, and even the characteristics of a solar cell become deteriorated due to pollution diffusion of metals that are eluted. On the other hand, the diffusing agent composition according to the present embodiment has composition that contains an alkoxysilane compound (C) and that does not contain water substantially. Thus, the elution of metal components from an ink-jet head or a screen mesh can be prevented.

When forming an impurity diffusion layer using the above-stated diffusing agent composition capable of suppressing the aggregation of impurity-diffusing components and the generation of out-diffusion, the impurity diffusion layer can be formed with higher accuracy. Further, the use of the diffusing agent composition allows for the formation of an impurity diffusion layer with higher accuracy. Thus, the reliability of a solar cell containing such an impurity diffusion layer can be improved.

The present invention is not limited to the above-mentioned embodiments, and various modifications, such as a design change, may be added thereto on the basis of knowledge of those skilled in the art. It should be understood that any embodiment to which one or more of the modifications are added is also included in the scope of the invention.

Exemplary Embodiments

The invention will now be described by reference to the preferred exemplary embodiments. This does not intend to limit the scope of the present invention, but to exemplify the invention.

<Evaluation Test I. Evaluation on Aggregation Suppressing Performance>

Respective components and contained amounts of diffusing agent compositions used in evaluation test I are shown in Table 1. In the following exemplary embodiments and comparative examples, a silicone-based surfactant (SF8421EG; manufactured by Dow Corning Toray Co., Ltd.) was used as a surfactant. In exemplary embodiments 1-7 and 9 and comparative examples 1-5, dipropylene glycol monomethyl ether (MFDG) is used as an organic solvent (D). When the entire mass of a diffusing agent composition is defined to be 100 percent by weight, the content of the solvent is all the remaining amount obtained after subtracting the content of the components from 100 percent by weight. In exemplary embodiment 8, propylene glycol monomethyl ether (PGME) and MFDG were used as organic solvents (D). The content of PGME is as shown in Table 1. When the entire mass of a diffusing agent composition is defined to be 100 percent by weight, the content of MFDG is the remaining amount obtained after subtracting the content of the components, including PGME, from 100 percent by weight.

TABLE 1

| | ALKOXYSILANE COMPOUND (C1) | | ALKOXYSILANE COMPOUND (C2) | | BORATE ESTER (A) | | POLYHYDRIC ALCOHOL (B) | |
| | STRUCTURE | SIO$_2$ CONVERTED CONTENT (wt %) | STRUCTURE | SIO$_2$ CONVERTED CONTENT (wt %) | COMPONENT | CONTENT (wt %) | COMPONENT | CONTENT (wt %) |
|---|---|---|---|---|---|---|---|---|
| EXEMPLARY EMBODIMENT 1 | C-1 | 6.37 | C-2 | 3.95 | TEB | 4.66 | MANNITOL | 10.47 |
| EXEMPLARY EMBODIMENT 2 | C-1 | 6.37 | C-2 | 3.95 | TEB | 9.32 | MPT | 15 |
| EXEMPLARY EMBODIMENT 3 | C-1 | 6.37 | C-2 | 3.95 | TEB | 9.32 | TMP | 15 |
| EXEMPLARY EMBODIMENT 4 | C-1 | 10.00 | — | — | TEB | 7.98 | EG | 10.18 |
| EXEMPLARY EMBODIMENT 5 | C-1 | 10.00 | — | — | TEB | 7.99 | PG | 12.5 |
| EXEMPLARY EMBODIMENT 6 | C-1 | 10.00 | — | — | TEB | 7.99 | 1,3-BD | 14.79 |
| EXEMPLARY EMBODIMENT 7 | C-1 | 6.37 | — | — | TMB | 5.67 | TMP | 14.63 |
| EXEMPLARY EMBODIMENT 8 | C-3 | 15.0 | — | — | TEB | 11.6 | TMP | 21.3 |
| EXEMPLARY EMBODIMENT 9 | C-4 | 10.3 | — | — | TEB | 8.0 | TMP | 7.3 |
| COMPARATIVE EXAMPLE 1 | C-1 | 6.37 | C-2 | 3.95 | TEB | 9.32 | — | — |
| COMPARATIVE EXAMPLE 2 | C-1 | 6.37 | C-2 | 3.95 | TEB | 9.32 | PPG | 1.5 |
| COMPARATIVE EXAMPLE 3 | C-1 | 10.00 | — | — | TEB | 8.00 | — | — |
| COMPARATIVE EXAMPLE 4 | C-1 | 10.00 | — | — | TEB | 7.99 | 1,4-BD | 14.79 |

TABLE 1-continued

| | | | | | | | | |
|---|---|---|---|---|---|---|---|---|
| COMPARATIVE EXAMPLE 5 | C-1 | 10.00 | — | — | TMB | 5.67 | — | — |

| | MOLAR RATIO (A:B) OF BORATE ESTER (A) AND POLYHYDRIC ALCOHOL (B) | SURFACTANT (ppm) | ORGANIC SOLVENT (D) | AGGREGATION SUPPRESSING PERFORMANCE |
|---|---|---|---|---|
| EXEMPLARY EMBODIMENT 1 | 2:1 | 500 | MFDG | ○ |
| EXEMPLARY EMBODIMENT 2 | 1:1 | 500 | MFDG | ○ |
| EXEMPLARY EMBODIMENT 3 | 1:1 | 500 | MFDG | ○ |
| EXEMPLARY EMBODIMENT 4 | 1:3 | 500 | MFDG | ○ |
| EXEMPLARY EMBODIMENT 5 | 1:3 | 500 | MFDG | ○ |
| EXEMPLARY EMBODIMENT 6 | 1:3 | 500 | MFDG | ○ |
| EXEMPLARY EMBODIMENT 7 | 1:2 | 500 | MFDG | ○ |
| EXEMPLARY EMBODIMENT 8 | 1:2 | 500 | PGME    MFDG 31.9 wt % | ○ |
| EXEMPLARY EMBODIMENT 9 | 1:1 | 500 | MFDG | ○ |
| COMPARATIVE EXAMPLE 1 | — | 500 | MFDG | x |
| COMPARATIVE EXAMPLE 2 | : | 500 | MFDG | x |
| COMPARATIVE EXAMPLE 3 | — | 500 | MFDG | x |
| COMPARATIVE EXAMPLE 4 | 1:3 | 500 | MFDG | x |
| COMPARATIVE EXAMPLE 5 | — | 500 | MFDG | x |

Abbreviations shown in Table 1 represent the following compounds.
TEB: triethyl borate
TMB: trimethyl borate
MPT: 3-methylpentane-1,3,5-triol
TMP: trimethylolpropane
EG: ethylene glycol
PG: propylene glycol
1,3-BD: 1,3-butanediol
1,4-BD: 1,4-butanediol
MFDG: dipropylene glycol monomethyl ether
PGME: propylene glycol monomethyl ether
PPG: polypropylene glycol A structure C-1 shown in Table 1 is a condensation product made from tetraethoxysilane ($Si(OC_2H_5)_4$) as a starting material. Structures C-2, C-3, and C-4 are condensation products represented by the following formulae (8), (9), and (10), respectively. The molecular weight of the condensation product of the structure C-4 is approximately 1000±500.

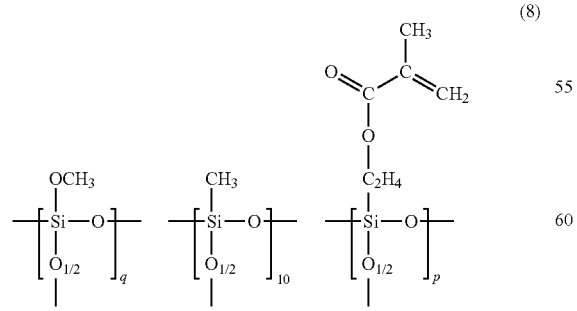

(8)

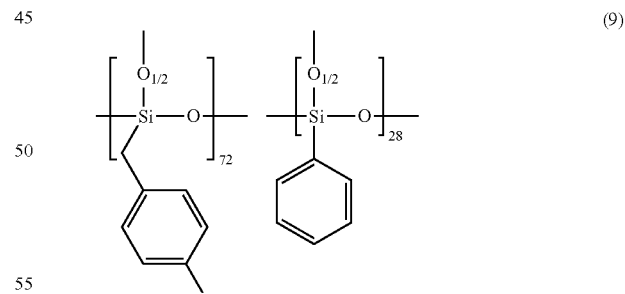

(9)

[In the general formula (8), p:q is in a range of 40:20]

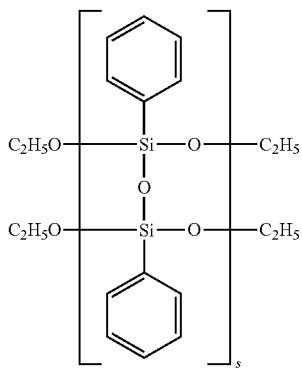

[In the general formula (10), s is in a range of 2 to 5.]

(Formation of Impurity-Diffusing Agent Layer)

Diffusing agent compositions according to exemplary embodiments 1-9 and comparative examples 1-5, which were prepared in accordance with the above-described method of preparing a diffusing agent composition, were applied on respective sample substrates using a coater (SS8261NUU: manufactured by TOKYO OHKA KOGYO CO., LTD.). The samples were then placed on a hotplate and went through a prebaking treatment for three minutes at 150° C. Through the above steps, an impurity-diffusing agent layer having a thickness of 300 nm was obtained for exemplary embodiments 1-7 and comparative examples 1-5, and an impurity-diffusing agent layer having a thickness of 500 nm was obtained for exemplary embodiments 8 and 9.

(Observation of Aggregation of Impurity-Diffusing Components)

For impurity-diffusing agent layers according to the respective exemplary embodiments and comparative examples, the presence of aggregation of borate esters (A) was checked by microscopic observation so as to evaluate aggregation suppressing performance. When no aggregation was observed, "○" meaning good was entered. When aggregation was observed, "x" meaning inadequate was entered. Results are shown in Table 1.

As shown in Table 1, comparative examples 1-5, which do not contain polyhydric alcohols (B) expressed by the above general formula (1), showed inadequate aggregation suppressing performance. On the other hand, exemplary embodiments 1-9, which contain polyhydric alcohols (B) expressed by the above general formula (1), showed good aggregation suppressing performance. From this, it was confirmed that aggregation of borate esters (A) can be suppressed when a borate ester (A) and a polyhydric alcohol (B) expressed by the above general formula (1) are contained in a diffusing agent composition.

<Evaluation Test II. Evaluation on Out-Diffusion Suppressing Performance>

Figure 3A:
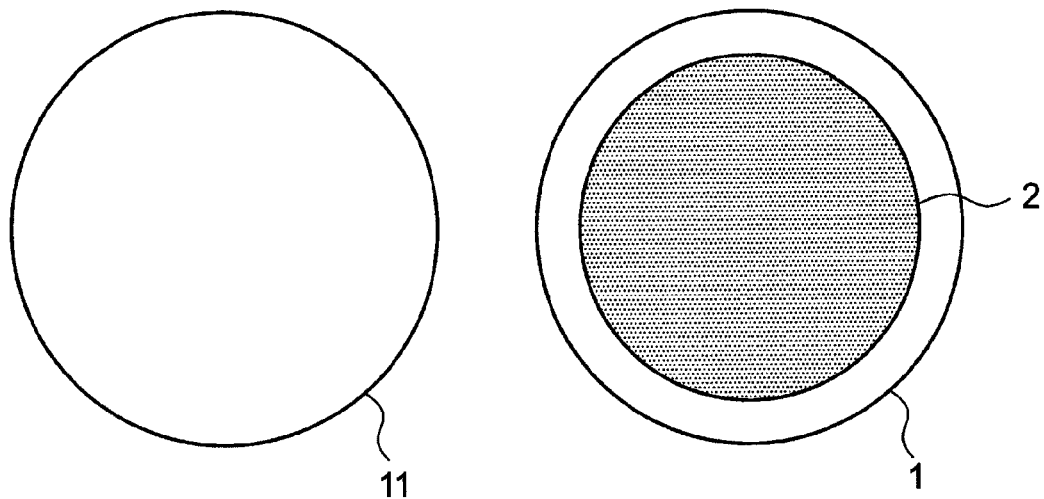
FIG. 3A and FIG. 3B are schematic diagrams for explaining a thermal diffusion process in an evaluation test for out-diffusion suppressing performance.
Figure 3B:
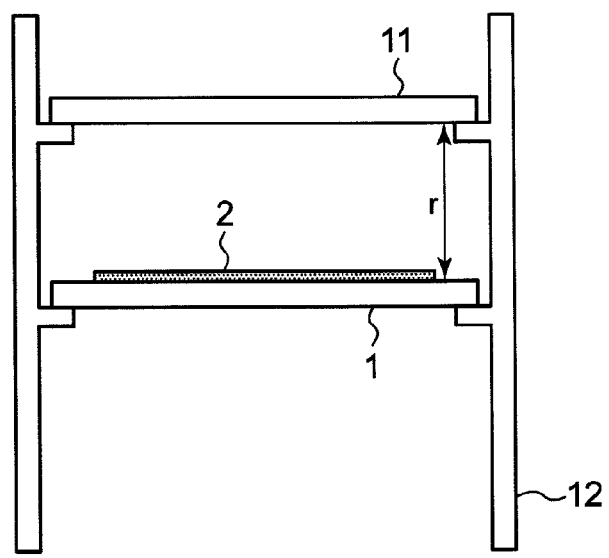

An explanation is given regarding evaluation test II in reference to FIG. 3. FIG. 3A and FIG. 3B are schematic diagrams for explaining a thermal diffusion process in an evaluation test for out-diffusion suppressing performance.

First, diffusing agent compositions according to exemplary embodiments 1-3 and comparative example 2 in the above-described evaluation test I were prepared. Also, as comparative example 6, a boron-containing impurity-diffusing agent (PBF 3P-31A: manufactured by TOKYO OHKA KOGYO CO., LTD.), which was a conventionally-known PBF, was prepared.

(Formation of Impurity-Diffusing Agent Layer)

The diffusing agent compositions of exemplary embodiments 1-3 and the diffusing agent compositions of comparative examples 2 and 6 were applied on respective n-type semiconductor substrates using a coater (SS8261NUU: manufactured by TOKYO OHKA KOGYO CO., LTD.). The sample substrates were then placed on a hotplate and went through a prebaking treatment for 0.5 minute at 200° C. for exemplary embodiments 1-3 and comparative example 2 and for three minutes at 150° C. for comparative example 6. Through the above steps, an impurity-diffusing agent layer having a thickness of 800 nm was obtained for exemplary embodiments 1-3 and comparative example 2, and an impurity-diffusing agent layer having a thickness of 400 nm was obtained for comparative example 6.

Then, as shown in FIG. 3A, a dummy substrate 11 on which a diffusing agent composition 2 was not applied was prepared separately from a semiconductor substrate 1 on which a diffusing agent composition 2 was applied. As shown in FIG. 3B, semiconductor substrates 1 according to exemplary embodiments 1-3 and comparative examples 2 and 6 and the dummy substrate 11 were placed adjacent to each other in a diffusion furnace 12. A distance r between a semiconductor substrate 1 and the dummy substrate 11 was set to be 4 mm. For the diffusion furnace 12, VF-1000 manufactured by Koyo Thermo Systems Co., Ltd. was used. The semiconductor substrate 1 and the dummy substrate 11 were burned for 30 minutes at 600° C. in $O_2$ in the diffusion furnace 12. Then, the respective semiconductor substrates 1 of exemplary embodiments 1-3 and comparative example 2 were heated for 15 minutes at 985° C. in $N_2$, and the semiconductor substrate 1 of comparative example 6 was heated for 30 minutes at 950° C. in $N_2$ so as to thermally diffuse boron.

(Measurement of Sheet Resistance Values)

Regarding exemplary embodiments 1-3 and comparative examples 2 and 6, the sheet resistance values of respective semiconductor substrates 1 (coated substrates) and the sheet resistance value of the dummy substrates 11 were measured based on a four-point probe method using a sheet resistance meter (VR-70 manufactured by Kokusai Electric Co., Ltd.). For each of the semiconductor substrates 1 and the dummy substrates 11, sheet resistance values at 25 points were measured, and average values thereof were calculated. Also, respective resistance value ratios (the size of the sheet resistance value of the dummy substrate 11 with respect to the sheet resistance value of a semiconductor substrate 1) were calculated. Results are shown in Table 2.

TABLE 2

| | COATING SUBSTRATE SHEET RESISTANCE (Ω/sq.) | NEIGHBORING SUBSTRATE SHEET RESISTANCE (Ω/sq.) | RESISTANCE VALUE RATIO (NEIGHBORING SUBSTRATE/ COATING SUBSTRATE) |
|---|---|---|---|
| EXEMPLARY EMBODIMENT 1 | 30.3 | 414.20 | 13.7 |
| EXEMPLARY | 46.6 | 727.60 | 15.6 |

TABLE 2-continued

| | COATING SUBSTRATE SHEET RESISTANCE (Ω/sq.) | NEIGHBORING SUBSTRATE SHEET RESISTANCE (Ω/sq.) | RESISTANCE VALUE RATIO (NEIGHBORING SUBSTRATE/ COATING SUBSTRATE) |
|---|---|---|---|
| EMBODIMENT 2 | | | |
| EXEMPLARY EMBODIMENT 3 | 32.3 | 481.30 | 14.9 |
| COMPARATIVE EXAMPLE 2 | 245.6 | 863.40 | 3.5 |
| COMPARATIVE EXAMPLE 6 | 61.4 | 53.80 | 0.9 |

As shown in Table 2, all the exemplary embodiments showed sheet resistance value ratios that were higher than those of comparative examples 2 and 6. Regarding comparative examples 2 and 6, it can be considered that boron is scattered to the outside of a coating film from a diffusing agent composition applied on a semiconductor substrate 1 and became attached to the dummy substrate 11 and that the sheet resistance value of the dummy substrate was lowered, reducing a corresponding resistance value ratio, as a result of the attached boron diffusing in the dummy substrate 11. On the other hand, regarding exemplary embodiments 1-3, it can be considered that the resistance value ratios were kept at high values since scattering of boron to the outside of a coating film, i.e., out-diffusion was suppressed, preventing the sheet resistance value of the dummy substrate 11 from being lowered. Therefore, it can be understood that out-diffusion of boron can be suppressed when a borate ester (A) and a polyhydric alcohol (B) expressed by the above general formula (1) are contained in a diffusing agent composition.

For example, embodiments according to the following combinations can be also included in the scope of the present invention.

(Item 1)

A diffusing agent composition used to form an impurity-diffusing agent layer on a semiconductor substrate, comprising:

a borate ester (A);

a polyhydric alcohol (B) expressed by the following general formula (1); and an alkoxysilane compound (C):

[Formula 1]

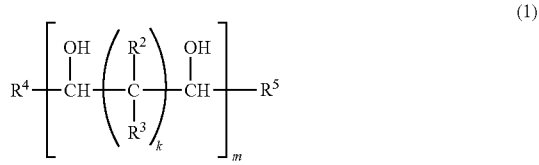

(1)

[In the general formula (1), k represents an integer of 0 to 3, m represents an integer of 1 or more, and $R^2$ and $R^3$ each individually represent a hydrogen atom, a hydroxyl group, an alkyl group having 1 to 5 carbon atoms, or a hydroxyalkyl group having 1 to 5 carbon atoms. When there are a plurality of $R^2$s and $R^3$s, the plurality of $R^2$s and $R^3$s may be the same or different from one another. When k is 2 or more, the plurality of $R^2$s and $R^3$s always contain one or more hydroxyl group or hydroxyalkyl group having 1 to 5 carbon atoms. $R^4$ and $R^5$ each individually represent a hydrogen atom or an alkyl group having 1 to 3 carbon atoms.]

(Item 2)

The diffusing agent composition according to item 1, wherein the borate ester (A) is represented by the following general formula (2):

$$B(OR^1)_3 \qquad (2)$$

[In the general formula (2), each $R^1$ individually represents an alkyl group having 1 to 10 carbon atoms or an aryl group having 6 to 10 carbon atoms. Three $R^1$s may all be the same or different.]

(Item 3)

The diffusing agent composition according to item 1 or 2, wherein the content of the borate ester (A) is 5-fold by mol or less relative to the content of the polyhydric alcohol (B).

(Item 4)

The diffusing agent composition according to any one of items 1 through 3 that does not substantially contain water.

(Item 5)

The diffusing agent composition according to any one of items 1 through 4, wherein the alkoxysilane compound (C) includes a reaction product obtained by hydrolyzing an alkoxysilane represented by the following general formula (3):

$$R^6{}_n Si(OR^7)_{4-n} \qquad (3)$$

[In the general formula (3), $R^6$ is a hydrogen atom or an organic group, $R^7$ is an organic group, and n represents an integer of 0, 1 or 2. When there are a plurality of $R^6$s, the plurality of $R^6$s may be the same or different from one another. When there are a plurality of $(OR^7)$, the plurality of $(OR^7)$s may be the same or different from one another.]

(Item 6)

The diffusing agent composition according to any one of items 1 through 5 that contains an organic solvent (D) other than the polyhydric alcohol (B).

(Item 7)

The diffusing agent composition according to any one of items 1 through 6 that is used to form an impurity-diffusing agent layer having a predetermined pattern by selective application.

(Item 8)

A method of forming an impurity diffusion layer, comprising:

patterning a semiconductor substrate to form an impurity-diffusing agent layer of a predetermined pattern by selectively applying the diffusing agent composition according to any one of items 1 through 7 onto the semiconductor substrate; and diffusing boron of the borate ester (A) included in the diffusing agent composition into the semiconductor substrate.

(Item 9)

A solar cell comprising a semiconductor substrate in which an impurity diffusion layer is formed by the method of forming an impurity diffusion layer according to item 8.

The invention claimed is:

1. A diffusing agent composition used to form an impurity-diffusing agent layer on a semiconductor substrate, comprising:
   a borate ester (A) forming a complex with a polyhydric alcohol (B) expressed by the following general formula (1);
   an alkoxysilane compound (C); and an organic solvent (D) other than the polyhydric alcohol (B), wherein the content of the borate ester (A) is 5-fold by mol or less relative to the content of the polyhydric alcohol (B),

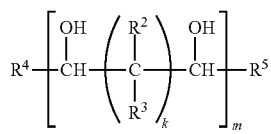
(1)

wherein k represents an integer of 0 to 3, m represents an integer of 1 or more, and R² and R³ each individually represent a hydrogen atom, a hydroxyl group, an alkyl group having 1 to 5 carbon atoms, or a hydroxyalkyl group having 1 to 5 carbon atoms; when there are a plurality of R²s and R³s, the plurality of R²s and R³s may be the same or different from one another; and when k is 2 or more, the plurality of R²s and R³s always contain one or more hydroxyl groups or hydroxyalkyl groups having 1 to 5 carbon atoms, wherein R⁴ and R⁵ each individually represent a hydrogen atom or an alkyl group having 1 to 3 carbon atoms.

2. The diffusing agent composition according to claim 1, wherein the borate ester (A) is represented by the following general formula (2):

$$B(OR^1)_3 \quad (2)$$

wherein each R¹ individually represents an alkyl group having 1 to 10 carbon atoms or an aryl group having 6 to 10 carbon atoms, and the three R¹s may all be the same or different.

3. The diffusing agent composition according claim 1 that does not substantially contain water.

4. The diffusing agent composition according to claim 1, wherein the alkoxysilane compound (C) includes a reaction product obtained by hydrolyzing an alkoxysilane represented by the following general formula (3):

$$R^6{}_n Si(OR^7)_{4-n} \quad (3)$$

wherein R⁶ is a hydrogen atom or an organic group, R⁷ is an organic group, and n represents an integer of 0, 1 or 2; when there are a plurality of R⁶s, the plurality of R⁶s may be the same or different from one another; and when there are a plurality of (OR⁷)s, the plurality of (OR⁷)s may be the same or different from one another.

5. The diffusing agent composition according to claim 1, wherein the diffusing agent composition is used to form an impurity-diffusing agent layer having a predetermined pattern by selective application.

6. A method of forming an impurity diffusion layer, comprising:
   patterning a semiconductor substrate to form an impurity-diffusing agent layer of a predetermined pattern by selectively applying the diffusing agent composition according to claim 1 onto the semiconductor substrate; and
   diffusing boron of the borate ester (A) included in the diffusing agent composition into the semiconductor substrate.

* * * * *

UNITED STATES PATENT AND TRADEMARK OFFICE
CERTIFICATE OF CORRECTION

PATENT NO.        : 9,048,175 B2                                        Page 1 of 1
APPLICATION NO.   : 14/342959
DATED             : June 2, 2015
INVENTOR(S)       : Takashi Kamizono and Toshiro Morita It is certified that error appears in the above-identified patent and that said Letters Patent is hereby corrected as shown below:

In the Specification

Col. 3, line 2, "This," should be --This--.

Col. 6, line 2, "group," should be --group--.

Col. 9, line 48, "surfactant," should be --surfactant, a--.

Col. 10, line 23, "FIG.10," should be --FIG.1C,--.

Col. 13, line 33, "l,3,5-triol" should be --1,3,5-triol--.

Col. 13, line 66, "40:20]" should be --40:20 to 50:10.]--.

In the Claims

Col. 20, line 5, "according" should be --according to--.

Signed and Sealed this
Third Day of May, 2016

Michelle K. Lee
*Director of the United States Patent and Trademark Office*